(12) United States Patent
Suetsugu

(10) Patent No.: US 7,592,585 B2
(45) Date of Patent: Sep. 22, 2009

(54) OPTICAL PICKUP

(75) Inventor: Masaaki Suetsugu, Daito (JP)

(73) Assignee: Funai Electric Co., Ltd. (JP)

( * ) Notice: Subject to any disclaimer, the term of this patent is extended or adjusted under 35 U.S.C. 154(b) by 77 days.

(21) Appl. No.: 11/905,871

(22) Filed: Oct. 5, 2007

(65) Prior Publication Data

US 2008/0251706 A1 Oct. 16, 2008

(30) Foreign Application Priority Data

Oct. 14, 2006 (JP) .............................. 2006-280801

(51) Int. Cl.
*H01J 40/14* (2006.01)
*G02B 7/04* (2006.01)
*G11B 7/00* (2006.01)

(52) U.S. Cl. ................. 250/239; 250/201.5; 369/44.11; 369/112.01

(58) Field of Classification Search .............. 250/201.5, 250/234, 239, 559.14, 559.29, 559.32, 559.34–559.36, 250/227.21; 369/44.11, 44.12, 44.14, 112.01, 369/112.23, 292; 359/381, 383, 391, 676, 359/683

See application file for complete search history.

(56) References Cited

U.S. PATENT DOCUMENTS

2005/0024750 A1 * 2/2005 Kato ........................... 359/813

FOREIGN PATENT DOCUMENTS

JP 5-27822 9/1993

* cited by examiner

*Primary Examiner*—Georgia Y Epps
*Assistant Examiner*—Don Williams
(74) *Attorney, Agent, or Firm*—Bacon & Thomas, PLLC

(57) ABSTRACT

The soldered connection of an end portion of a cable extending from each element with a main substrate is prevented from being broken. An end portion of a cable t1 extending from a light source element LD that is fixed to a standing frame 2A on a slide base 2 movable back-and-forth in the radial direction of a disk passes through an insertion opening 9 in the slide base 2 to be connected by soldering 8b to a main substrate 3, and an extended portion 15 extending from the peripheral edge of the insertion opening 9 close to the main substrate 3 is formed integrally with the slide base 2, the clearance "β" between the leading end face 15A of the extended portion 15 and the main substrate 3 being set slightly greater than the thickness "d" of the cable t1, so that the cable t1, if tensioned when positioning the light source element LD, is brought into contact with the edge 15a of the leading end face 15A.

8 Claims, 12 Drawing Sheets

OPTICAL PICKUP

BACKGROUND OF THE INVENTION

1. Field of the Invention

The present invention relates to an optical pickup to be used in a disk apparatus (e.g. DVD recorder or DVD player) and, particularly, in which the soldered connection of an end portion of a cable extending from an element with a main substrate cannot be broken.

2. Description of the Related Art

An optical pickup will be described schematically with reference to FIG. 7. A plastic slide base 2 is engaged in a back-and-forth movable manner with a pair of left and right guide rails 1 that extend in the radial direction X of a disk D. A printed-wiring main substrate 3 is mounted on one surface of the slide base 2, while a standing frame 2A is formed integrally on the other surface of the slide base 2. A laser diode light source element LD and photodiode reading and light-detecting elements PD1 and PD2 are positioned and fixed to the standing frame 2A, while a raising mirror M and a half mirror HM are arranged inside the standing frame 2A. An actuator 4 including an objective lens OL is further provided on the one surface of the slide base 2.

To describe the procedure of reading information, the disk D is rotated at a high speed and the actuator 4 is driven to move the objective lens OL in the focusing direction along a spindle 4a of the actuator 4 as well as to move the objective lens OL in the tracking direction, that is, in the radial direction X of the disk D around the spindle 4a. A laser beam "a" from the light source element LD is reflected at the half mirror HM and the raising mirror M to pass through the objective lens OL and be applied to the disk D, and then the reflected light "b" passes through the objective lens OL, reflected at the raising mirror M, and passes through the half mirror HM to be received at the reading element PD1. Thus, the information recorded on the disk D is read and the intensity of the laser beam "a" is detected by the light-detecting element PD2.

The configuration of a conventional optical pickup will be described with reference to FIGS. 8 to 13. FIG. 8 is a perspective view of the optical pickup; FIG. 9 is a vertical cross-sectional view around the light source element LD; FIG. 10 (a) is a view taken along the arrows D-D in FIG. 9 and FIG. 10 (b) is a view taken along the arrows E-E in FIG. 10 (a); FIG. 11 is a plan view around the reading element PD1; FIG. 12 is a front view of the reading element PD1; and FIG. 13 is a view taken along the arrows F-F in FIG. 11.

As shown in FIGS. 8 to 10, the light source element LD is fitted and fixed into a through hole 6a that is provided in the center of a rectangular metal block holder 6. An end portion of a flexible flat cable t1 connected by soldering 8a to terminal pins 7 of the light source element LD passes through an insertion opening 9 in the slide base 2 and enters between the slide base 2 and the main substrate 3 to be connected by soldering 8b to the main substrate 3.

To describe the procedure of positioning the light source element LD, the holder 6 is moved and positioned in the vertical direction Z and the horizontal direction Y with a protrusion 6b on the holder 6 being in contact with one side surface of the standing frame 2A, and the tilt of the holder 6 is fine-adjusted around the protrusion 6b. Then, the holder 6 is fixed to the side surface of the standing frame 2A by ultraviolet-setting adhesive or the like (not shown in the drawings).

As shown in FIGS. 11 to 13, the reading element PD1 is attached to a printed-wiring support substrate 11, and an end portion of a flexible flat cable t2 connected by soldering 8a to the support substrate 11 curves around the outer peripheral edge 2a of the slide base 2 and enters between the slide base 2 and the main substrate 3 to be connected by soldering 8b to the main substrate 3.

To describe the procedure of positioning the reading element PD1, the support substrate 11 is moved and positioned in the vertical direction Z and the horizontal direction Y with being in contact with one side surface of the standing frame 2A. Then, the support substrate 11 is fixed to the side surface of the standing frame 2A by ultraviolet-setting adhesive or the like (not shown in the drawings).

As shown in FIGS. 8 and 11, the light-detecting element PD2 is attached to a printed-wiring support substrate 12, and an end portion of a flexible flat cable t3 connected by soldering 8a to the support substrate 12 passes through an insertion opening 13 in the slide base 2 to be connected by soldering 8b to the main substrate 3.

To describe the procedure of positioning the light-detecting element PD2, the support substrate 12 is moved and positioned in the vertical direction Z and the horizontal direction Y with being in contact with one side surface of the standing frame 2A. Then, the support substrate 12 is fixed to the side surface of the standing frame 2A by ultraviolet-setting adhesive or the like (not shown in the drawings). It is noted that a related art is disclosed in Japanese Utility Model Laid-Open Publication No. Hei 5-27822.

As for the light source element LD shown in FIGS. 8 to 10, the clearance "α" between the insertion opening 9 and the main substrate 3 is significantly greater than the thickness "d" of the cable t1, as shown in FIG. 9. Therefore, if a tensile force "f" is applied to the cable t1 when the holder 6 is moved and positioned in the vertical direction Z, the tensile force "f" may concentrate at and thereby break the soldering 8b to result in a disconnection between the end portion of the cable t1 and the main substrate 3.

As for the reading element PD1 shown in FIGS. 11 to 13, the clearance "α" between the slide base 2 and the main substrate 3 is significantly greater than the thickness "d" of the cable t2, as shown in FIG. 13. Therefore, if a tensile force "f" is applied to the cable t2 when the support substrate 11 is moved and positioned in the vertical direction Z, the tensile force "f" may concentrate at and thereby break the soldering 8b to result in a disconnection between the end portion of the cable t2 and the main substrate 3.

As for the light-detecting element PD2 shown in FIGS. 8 and 11, the soldering 8b may also be broken in the same manner as described above to result in a disconnection between the end portion of the cable t3 and the main substrate 3.

SUMMARY OF THE INVENTION

The present invention has been made in consideration of the above-described conventional disadvantages, and an object thereof is to provide an optical pickup in which the soldered connection of an end portion of a cable extending from each element with a main substrate cannot be broken when positioning each element.

In order to achieve the foregoing object, a first aspect of the present invention is an optical pickup in which a printed-wiring main substrate is mounted on one surface of a slide base movable back-and-forth in the radial direction of a disk, while a standing frame is formed integrally on the other surface of the slide base, a light source element and reading and light-detecting elements being positioned and fixed to the standing frame, and end portions of flexible flat cables extending from the respective elements are soldered to the main substrate, where a laser beam from the light source element is adapted to be applied to the disk and the reflected light is adapted to be received at the reading element to read information recorded on the disk as well as to detect the intensity of the laser beam through the light-detecting element, wherein the slide base includes: an insertion opening for passage of the end portion of the cable extending from the light source element therethrough to solder the end portion to the main substrate; and an extended portion extending from the peripheral edge of the insertion opening close to the main substrate, the clearance between the leading end face of the extended portion and the main substrate being set slightly greater than the thickness of the cables, and the slide base further includes another extended portion extending from the outer peripheral edge of the slide base close to the main substrate, the clearance between the leading end face of the another extended portion and the main substrate being set slightly greater than the thickness of the cables.

A second aspect of the present invention is an optical pickup in which a printed-wiring main substrate is mounted on one surface of a slide base movable back-and-forth in the radial direction of a disk, while a standing frame is formed integrally on the other surface of the slide base, a light source element and reading and light-detecting elements being positioned and fixed to the standing frame, and end portions of flexible flat cables extending from the respective elements are soldered to the main substrate, where a laser beam from the light source element is adapted to be applied to the disk and the reflected light is adapted to be received at the reading element to read information recorded on the disk as well as to detect the intensity of the laser beam through the light-detecting element, wherein the slide base includes one or more extended portions extending close to the main substrate in the vicinity of the end portions of one or more of the cables, the clearance between the leading end faces of the one or more extended portions and the main substrate being set slightly greater than the thickness of the cables.

A third aspect of the present invention is an optical pickup in which a printed-wiring main substrate is mounted on one surface of a slide base movable back-and-forth in the radial direction of a disk, while a standing frame is formed integrally on the other surface of the slide base, a light source element and reading and light-detecting elements being positioned and fixed to the standing frame, and end portions of flexible flat cables extending from the respective elements are soldered to the main substrate, where a laser beam from the light source element is adapted to be applied to the disk and the reflected light is adapted to be received at the reading element to read information recorded on the disk as well as to detect the intensity of the laser beam through the light-detecting element, wherein the slide base includes: an insertion opening for passage of the end portion of the cable extending from the light source element therethrough to solder the end portion to the main substrate; and an extended portion extending from the peripheral edge of the insertion opening close to the main substrate, the clearance between the leading end face of the extended portion and the main substrate being set slightly greater than the thickness of the cables.

A fourth aspect of the present invention is an optical pickup in which a printed-wiring main substrate is mounted on one surface of a slide base movable back-and-forth in the radial direction of a disk, while a standing frame is formed integrally on the other surface of the slide base, a light source element and reading and light-detecting elements being positioned and fixed to the standing frame, and end portions of flexible flat cables extending from the respective elements are soldered to the main substrate, where a laser beam from the light source element is adapted to be applied to the disk and the reflected light is adapted to be received at the reading element to read information recorded on the disk as well as to detect the intensity of the laser beam through the light-detecting element, wherein the slide base includes an extended portion extending from the outer peripheral edge of the slide base close to the main substrate, the clearance between the leading end face of the extended portion and the main substrate being set slightly greater than the thickness of the cables.

In accordance with the first aspect, when the light source element is positioned with the end portion of the cable extending from the light source element passing through the insertion opening in the slide base to be soldered to the main substrate and if a tensile force due to the positioning is applied to the cable, the cable is brought into contact with the leading end edge of the extended portion extending from the peripheral edge of the insertion opening and thus the tensile force is dispersed to two parts, the contact portion and the soldering. Since each tensile force at each part is small, the soldered connection cannot be broken by the tensile force as in the conventional art.

Also, when the reading element is positioned with the end portion of the cable extending from the reading element entering between the slide base and the main substrate to be soldered to the main substrate and if a tensile force due to the positioning is applied to the cable, the cable is brought into contact with the leading end edge of the extended portion that is formed integrally with the slide base and thus the tensile force is dispersed to two parts, the contact portion and the soldering. Since each tensile force at each part is small, the soldered connection cannot be broken by the tensile force as in the conventional art. It is therefore possible to maintain the connection between each cable and the main substrate reliably.

In accordance with the second aspect, when each element is positioned with the end portion of the cable extending from the element being soldered to the main substrate and if a tensile force due to the positioning is applied to the cable, the cable is brought into contact with the leading end edge of each extended portion that is formed integrally with the slide base and thus the tensile force is dispersed to two parts, the contact portion and the soldering. Since each tensile force at each part is small, the soldered connection cannot be broken by the tensile force as in the conventional art, which allows the connection between each cable and the main substrate to be maintained reliably.

In accordance with the third aspect, when the light source element is positioned with the end portion of the cable extending from the light source element passing through the insertion opening in the slide base to be soldered to the main substrate and if a tensile force due to the positioning is applied to the cable, the cable is brought into contact with the leading end edge of the extended portion extending from the peripheral edge of the insertion opening and thus the tensile force is dispersed to two parts, the contact portion and the soldering. Since each tensile force at each part is small, the soldered connection cannot be broken by the tensile force as in the conventional art, which allows the connection between the cable and the main substrate to be maintained reliably.

In accordance with the fourth aspect, when the reading element is positioned with the end portion of the cable extending from the reading element entering between the slide base and the main substrate to be soldered to the main substrate and if a tensile force due to the positioning is applied to the cable, the cable is brought into contact with the leading end edge of the extended portion that is formed integrally with the slide base and thus the tensile force is dispersed to two parts, the contact portion and the soldering. Since each tensile force at each part is small, the soldered connection cannot be broken by the tensile force as in the conventional art, which allows the connection between the cable and the main substrate to be maintained reliably.

BRIEF DESCRIPTION OF THE DRAWINGS

FIG. 3 (b) is a view taken along the arrows B-B in FIG. 3 (a);

FIG. 10 (b) is a view taken along the arrows E-E in FIG. 10 (a);

DESCRIPTION OF THE PREFERRED EMBODIMENTS

Figure 1:
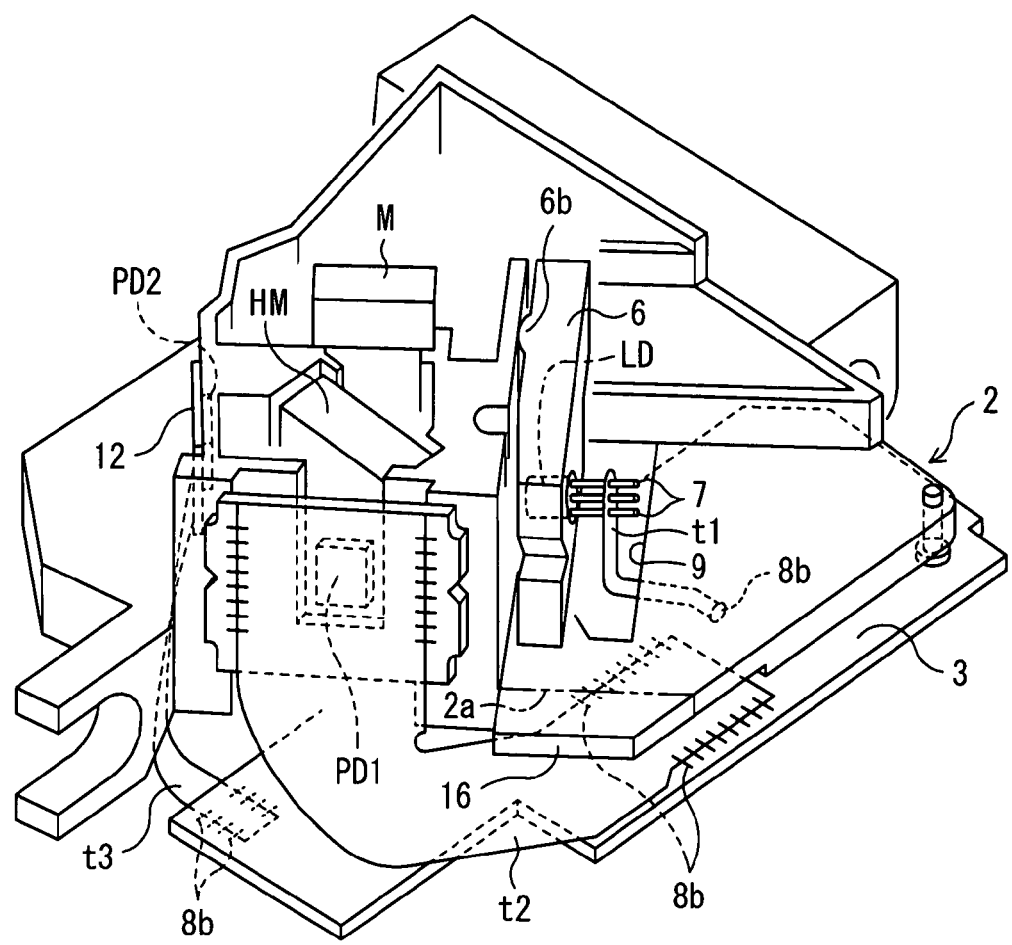
FIG. 1 is a perspective view of an optical pickup according to an embodiment of the present invention.
Figure 2:
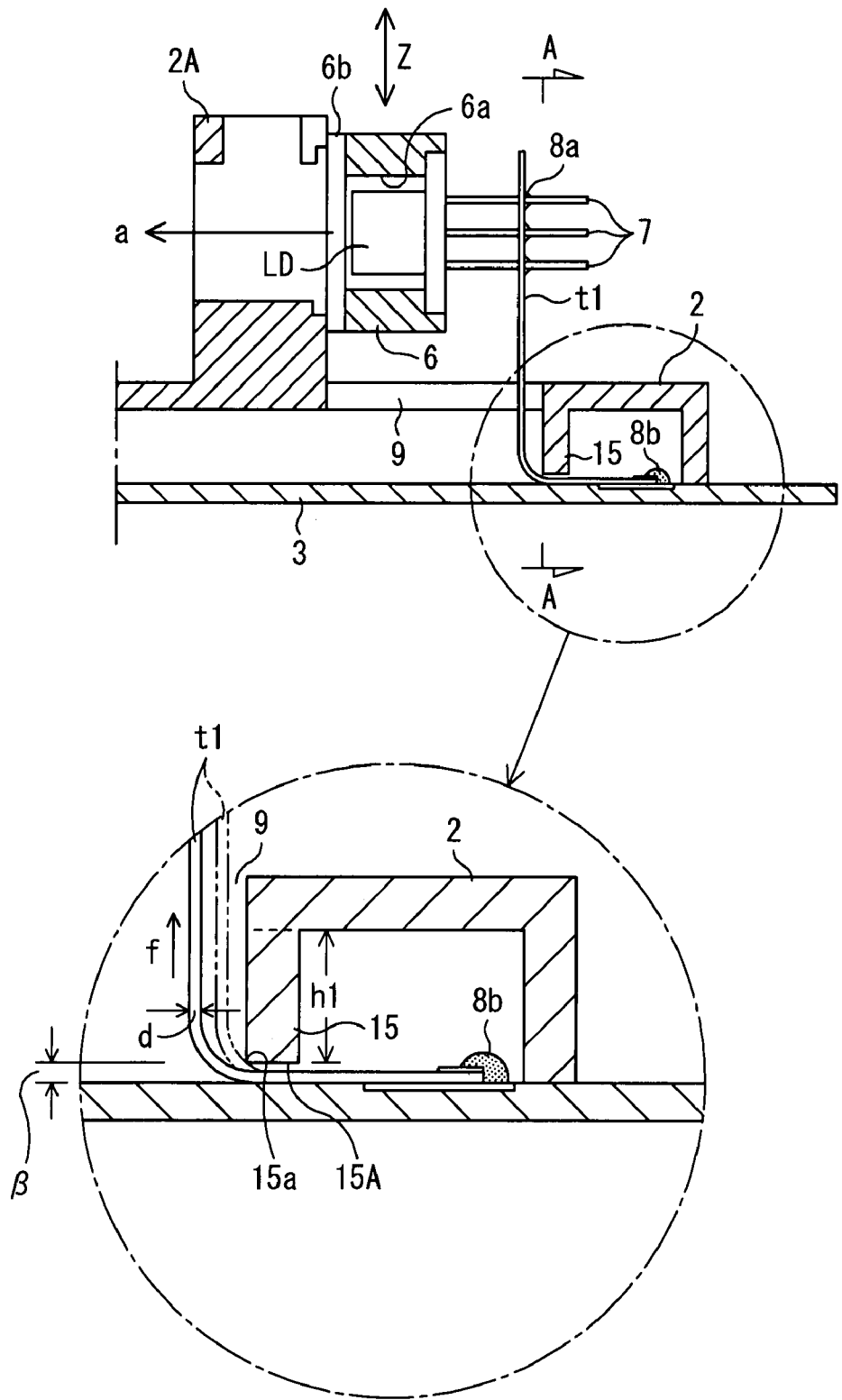
FIG. 2 is a vertical cross-sectional view around a light source element.
Figure 3A:
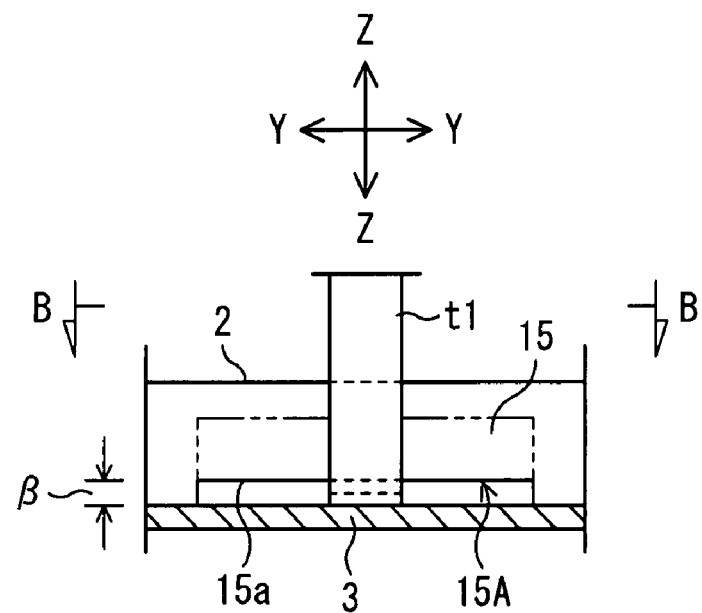
FIG. 3 (a) is a view taken along the arrows A-A in FIG. 2.
Figure 3B:
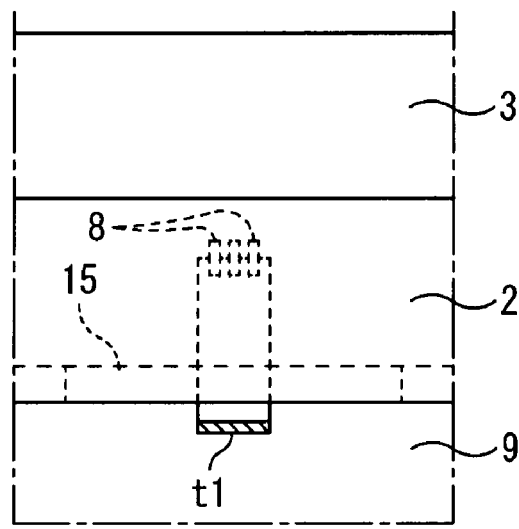
Figure 4:
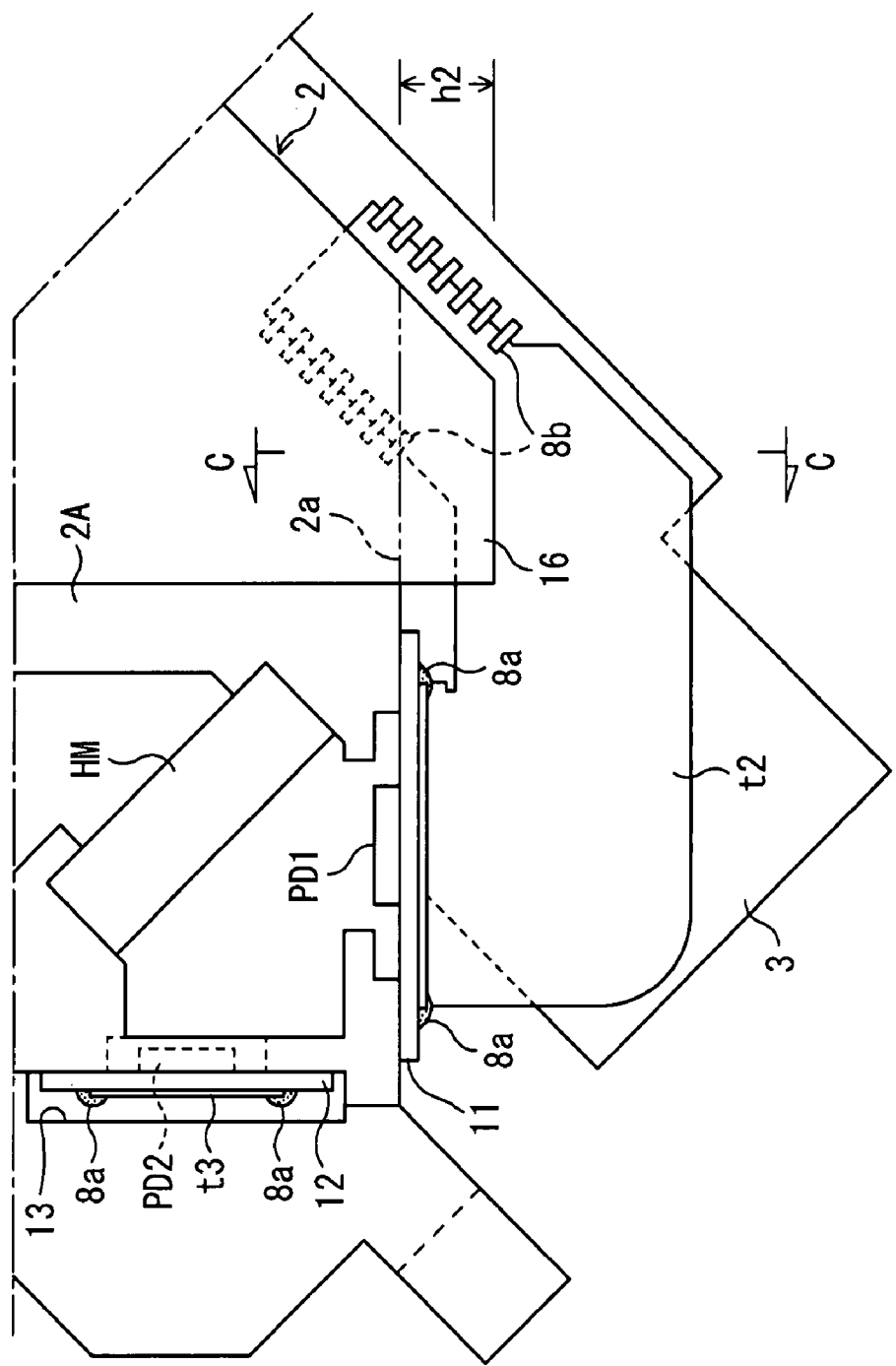
FIG. 4 is a plan view around a reading element.
Figure 5:
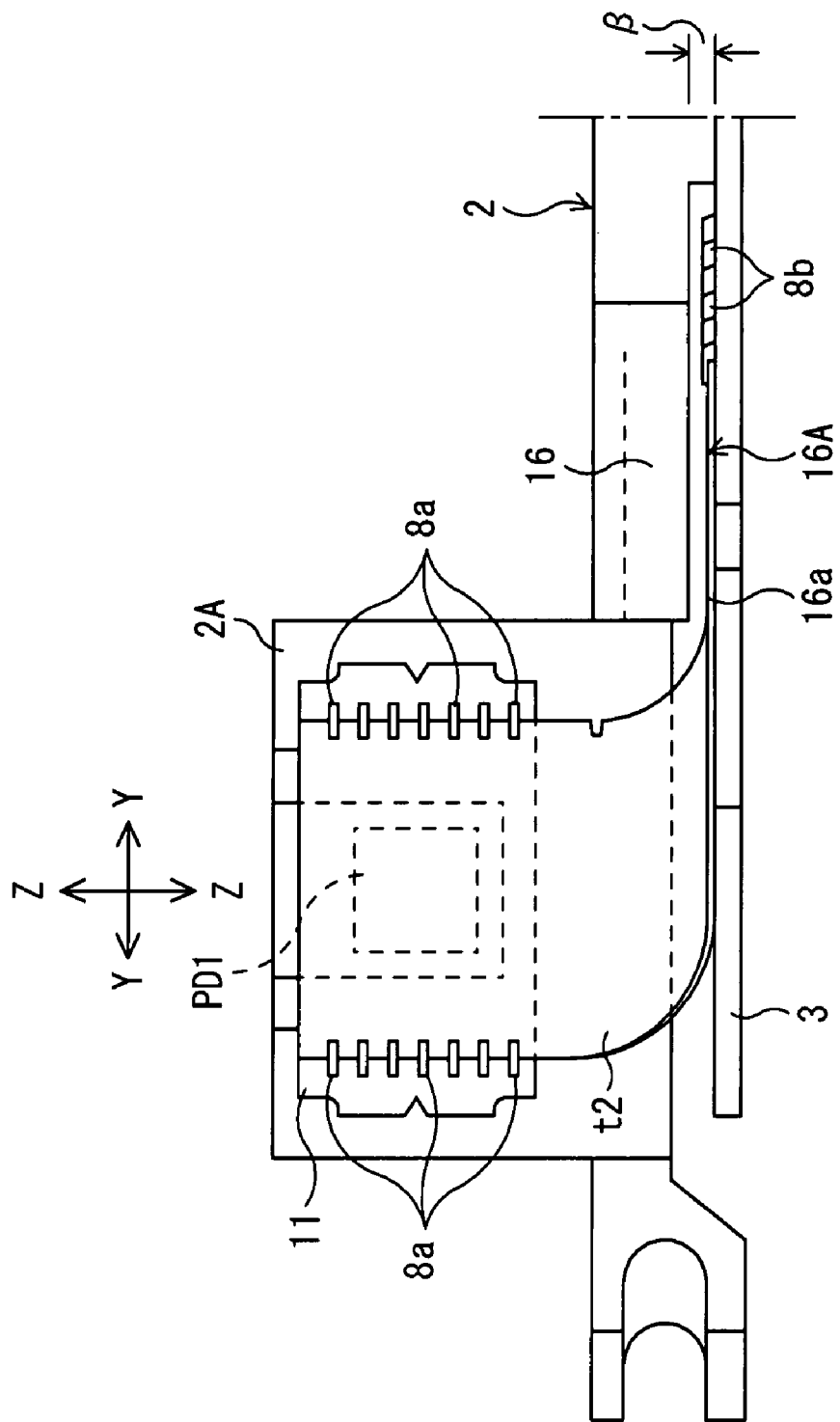
FIG. 5 is a front view of the reading element.
Figure 6:
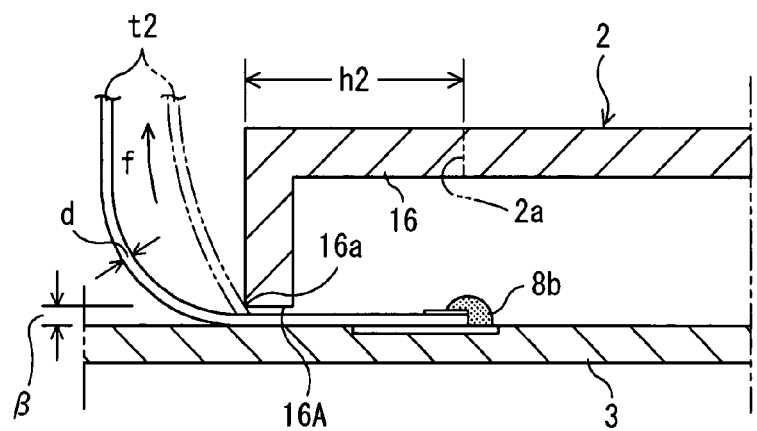
FIG. 6 is a view taken along the arrows C-C in FIG. 4.
Figure 7:
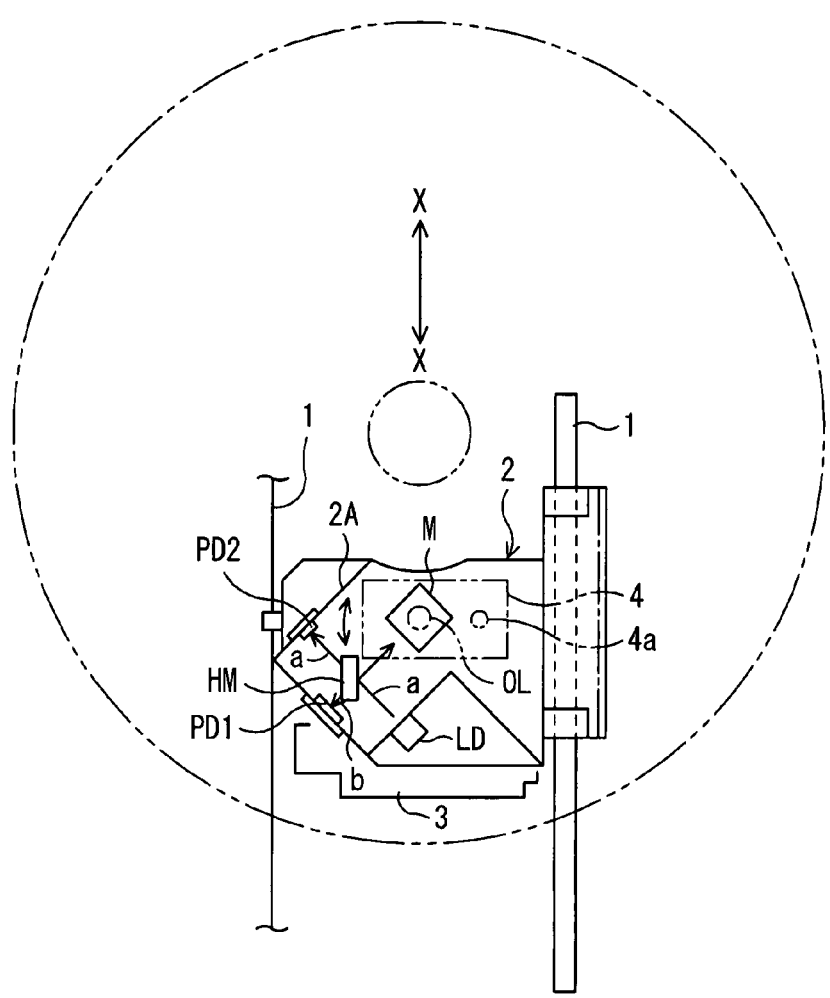
FIG. 7 is a schematic plan view of the optical pickup.
Figure 8:
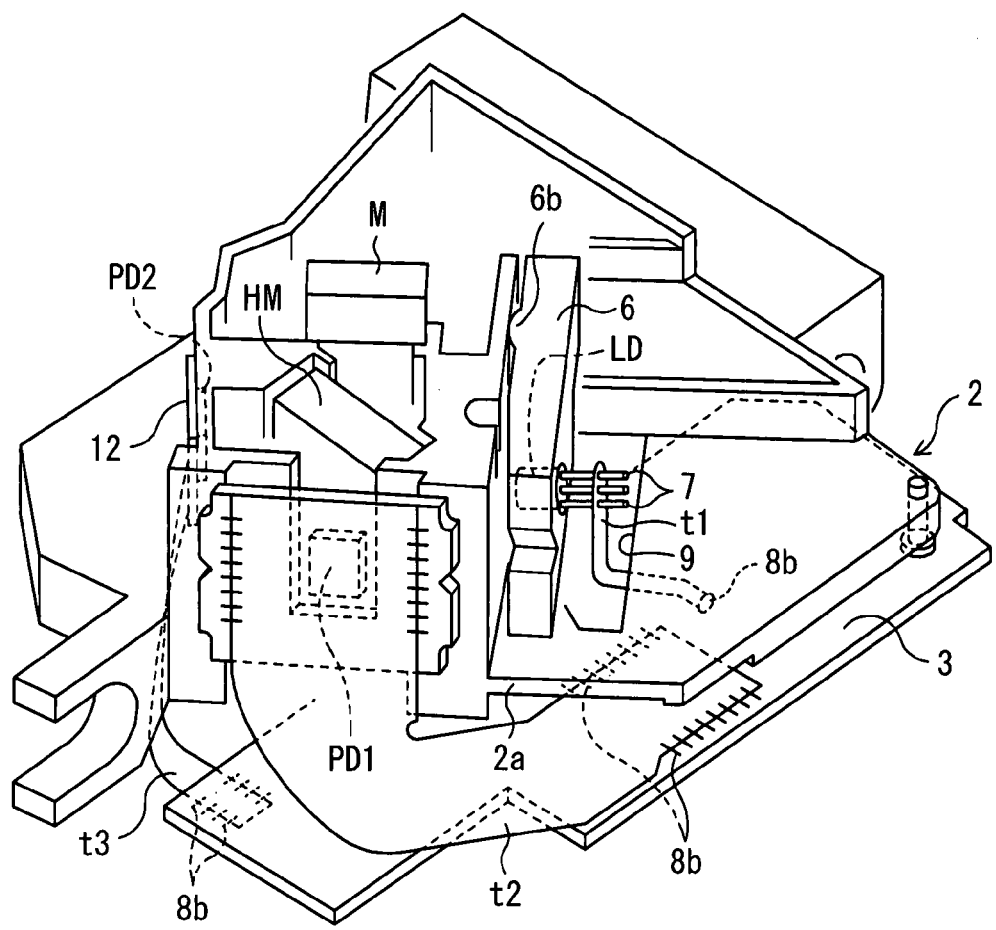
FIG. 8 is a perspective view of a conventional optical pickup.
Figure 9:
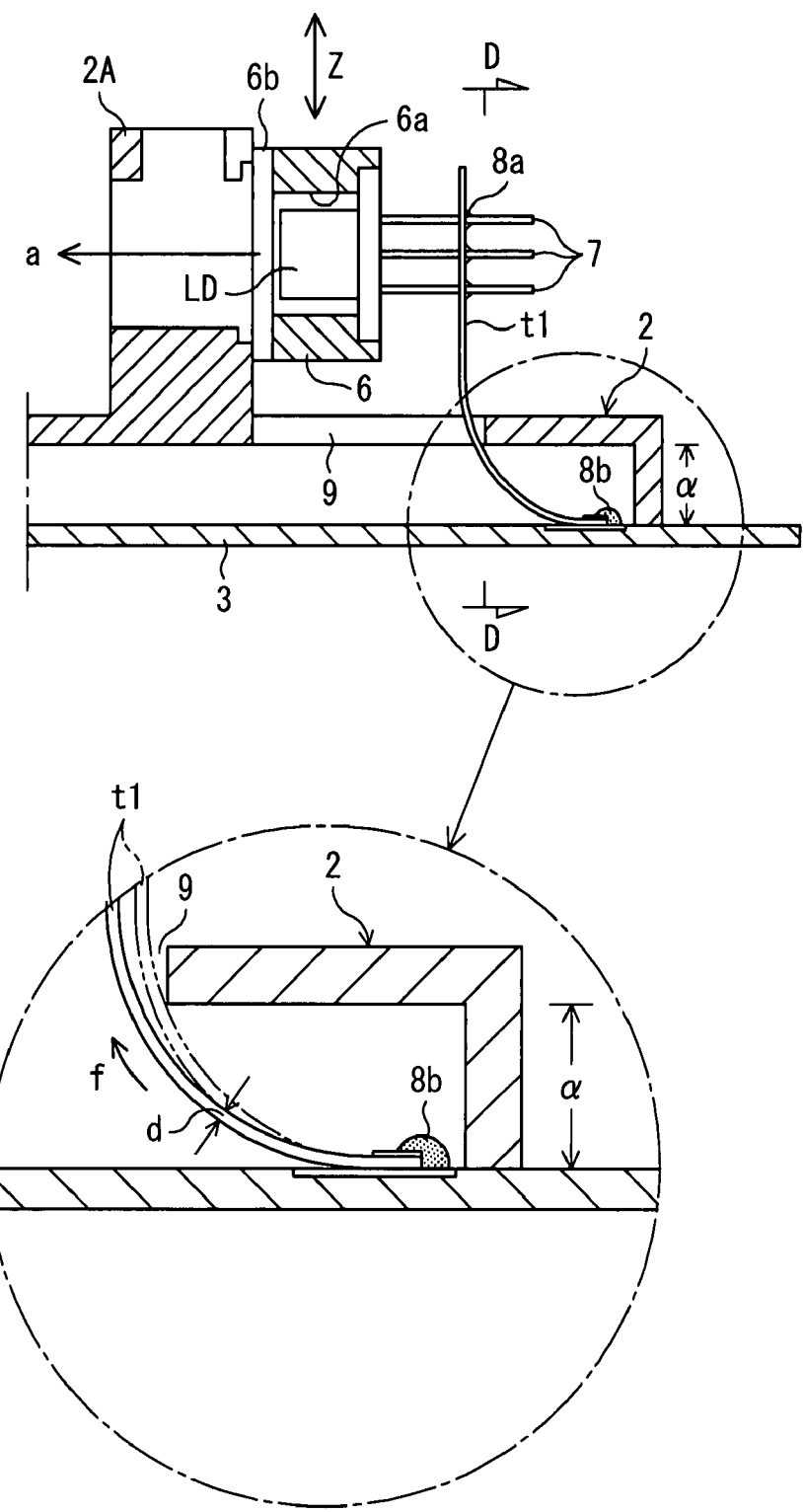
FIG. 9 is a vertical cross-sectional view around a light source element.
Figure 10A:
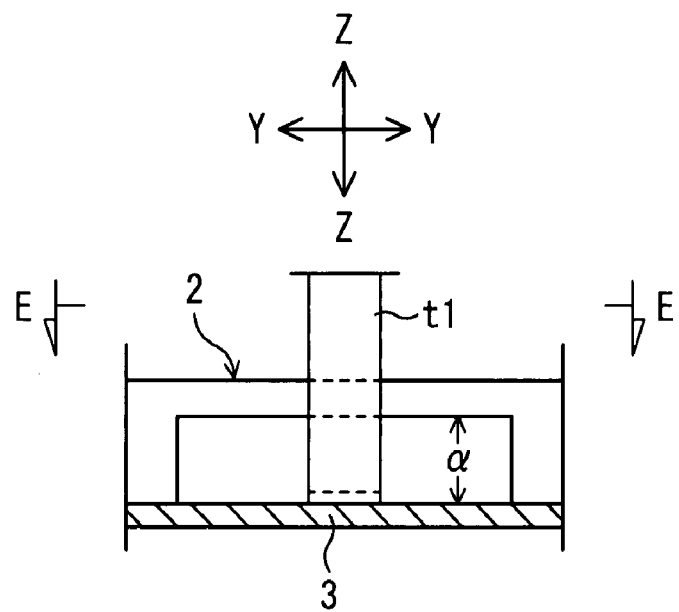
FIG. 10 (a) is a view taken along the arrows D-D in FIG. 9.
Figure 10B:
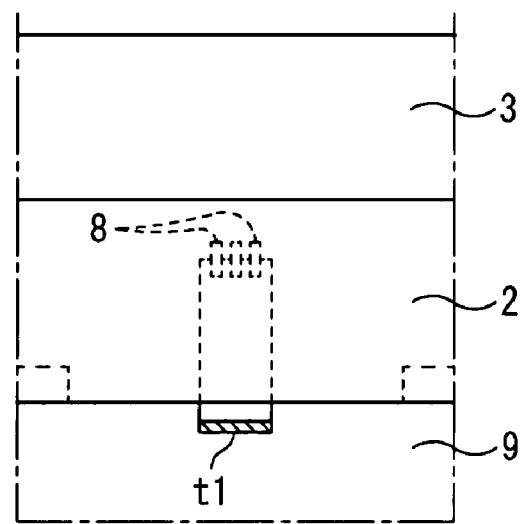

FIGS. 1 to 6 show an optical pickup according to an embodiment of the present invention. FIG. 1 is a perspective view of the optical pickup; FIG. 2 is a vertical cross-sectional view around a light source element LD; FIG. 3 (a) is a view taken along the arrows A-A in FIG. 2 and FIG. 3 (b) is a view taken along the arrows B-B in FIG. 3 (a); FIG. 4 is a plan view around a reading element PD1; FIG. 5 is a front view of the reading element PD1; and FIG. 6 is a view taken along the arrows C-C in FIG. 4.

As shown in FIGS. 1 to 3, an extended portion 15 extending from the peripheral edge of the insertion opening 9 for passage of the cable t1 extending from the light source element LD therethrough close to the main substrate 3 is formed integrally with the slide base 2 at a predetermined protruding length h1, and the clearance "β" between the leading end face 15A of the extended portion 15 and the main substrate 3 is set slightly greater than the thickness "d" of the cable t1. Since the arrangements other than those above are approximately the same as those shown in FIGS. 7 to 10, identical components are designated by the same reference numerals to omit the descriptions thereof.

In accordance with the arrangement above, when the light source element LD is moved and positioned in the vertical direction Z and the horizontal direction Y and if a tensile force "f" due to the positioning is applied to the cable t1, the cable t1 is brought into contact with the edge 15a of the leading end face 15A of the extended portion 15 extending from the peripheral edge of the insertion opening 9 (refer to the enlarged view of FIG. 2) and thus the tensile force "f" is dispersed to two parts, the contact portion 15a and the soldering 8b. Since each tensile force "f" at each part 15a and 8b is small, the soldering 8b cannot be broken by the tensile force "f" as in the conventional art, which allows the connection between the cable t1 and the main substrate 3 to be maintained reliably.

Figure 11:
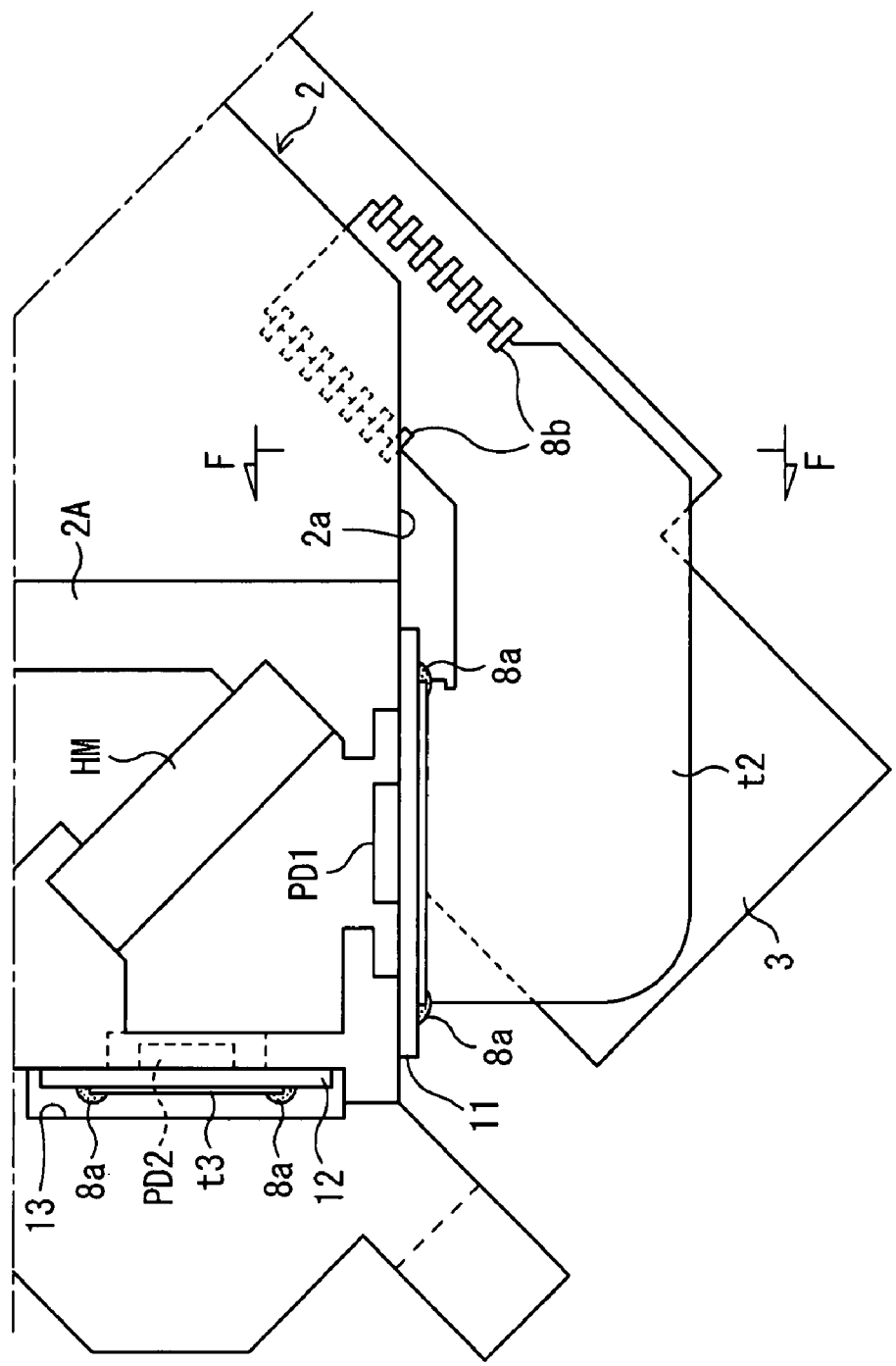
FIG. 11 is a plan view around a reading element.
Figure 12:
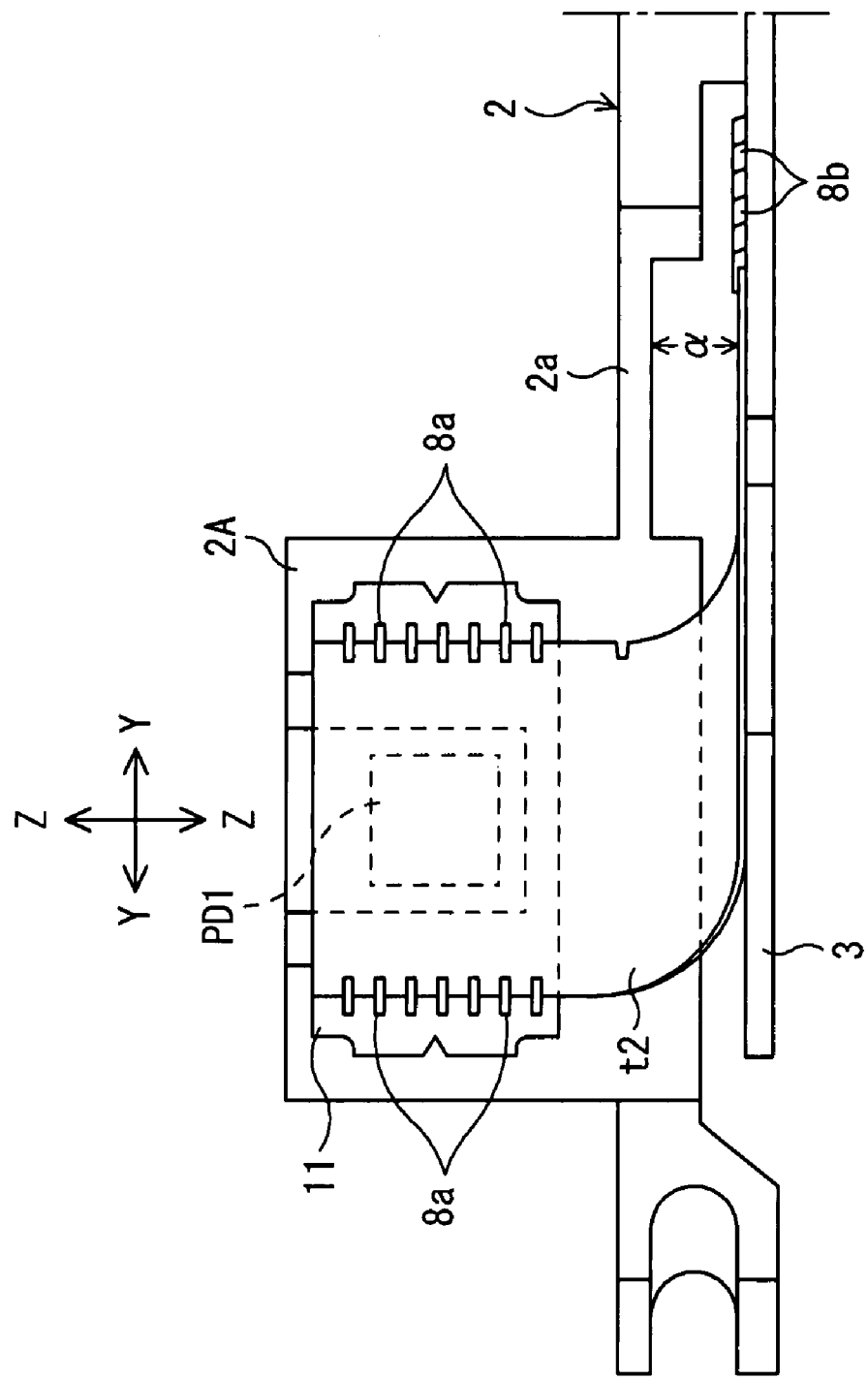
FIG. 12 is a front view of the reading element.
Figure 13:
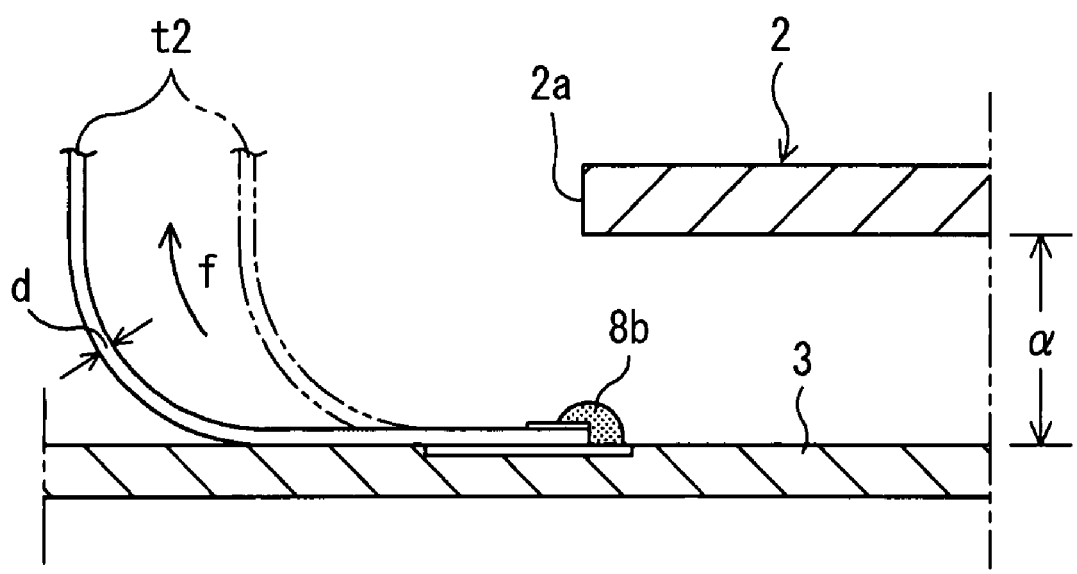
FIG. 13 is a view taken along the arrows F-F in FIG. 11.

As shown in FIGS. 4 to 6, an extended portion 16 having an approximately L shape in a vertical cross-section and extending close to the main substrate 3 in the vicinity of the end portion of the cable t2 extending from the reading element PD1 is formed integrally with the slide base 2 at a predetermined protruding length h2 sideward from the original outer peripheral edge 2a of the slide base 2, and the clearance "β" between the leading end face 16A of the extended portion 16 and the main substrate 3 is set slightly greater than the thickness "d" of the cable t2. Since the arrangements other than those above are approximately the same as those shown in FIGS. 11 to 13, identical components are designated by the same reference numerals to omit the descriptions thereof.

In accordance with the arrangement above, when the reading element PD1 is moved and positioned in the vertical direction Z and the horizontal direction Y and if a tensile force "f" due to the positioning is applied to the cable t2, the cable t2 is brought into contact with the edge 16a of the leading end face 16A of the extended portion 16 that is formed integrally with the slide base 2 (refer to the enlarged view of FIG. 6) and thus the tensile force "f" is dispersed to two parts, the contact portion 16a and the soldering 8b. Since each tensile force "f" at each part 16a and 8b is small, the soldering 8b cannot be broken by the tensile force "f" as in the conventional art, which allows the connection between the cable t2 and the main substrate 3 to be maintained reliably.

As a specific dimensional example, the thickness "d" of the cable t1 is 0.15 mm and the clearance "β" is 0.2 mm.

Although the above-described embodiment shows a structure for preventing the soldered connection 8b of the end portions of the cables t1 and t2 extending, respectively, from the light source element LD and the reading element PD1 with the main substrate 3 from being broken, the present invention is not restricted to such a structure. The light-detecting element PD2 shown in FIGS. 1 and 4 may also employ the same structure to prevent the soldered connection 8b of the end portion of the cable t3 with the main substrate 3 from being broken.

What is claimed is:

1. An optical pickup in which a printed-wiring main substrate is mounted on one surface of a slide base movable back-and-forth in the radial direction of a disk, while a standing frame is formed integrally on a second surface of said slide base, opposite said one surface, a light source element and reading and light-detecting elements being positioned and fixed to said standing frame, and end portions of flexible flat cables extending from said respective elements are soldered to said main substrate at solder connections, where a laser beam from said light source element is adapted to be applied to the disk and the reflected light is adapted to be received at said reading element to read information recorded on the disk as well as to detect the intensity of the laser beam through said light-detecting element, wherein said slide base comprises:

a planar portion spaced from and parallel to said main substrate;

an insertion opening in said planar portion through which extends an end portion of one of said cables extending from said light source element to a solder connection on said main substrate;

a first extended portion integral with said planar portion and extending from a peripheral edge of said insertion opening, at an angle with said planar portion and toward said main substrate, said first extended portion having a distal end face spaced from said main substrate to define a first gap therebetween which is slightly greater than the thickness of said one cable, said first cable extending through said first gap; and a second extended portion integral with and extending from an outer peripheral edge of said planar portion of said slide base at an angle with said planar portion and toward said main substrate, said second extended portion having a distal end face spaced from said main substrate to define a second gap therebetween slightly greater than the thickness of another of said cables, said another cable extending through said second gap.

2. An optical pick-up according to claim 1 wherein said distal end of said first extended portion is spaced from the solder connection in a direction parallel to said planar portion.

3. An optical pickup in which a printed-wiring main substrate is mounted on one surface of a slide base movable back-and-forth in the radial direction of a disk, while a standing frame is formed integrally on a second surface of said slide base, opposite said one surface, a light source element and reading and light-detecting elements being positioned and fixed to said standing frame, and end portions of flexible flat cables extending from said respective elements are soldered to said main substrate at soldered connections, where a laser beam from said light source element is adapted to be applied to the disk and the reflected light is adapted to be received at said reading element to read information recorded on the disk as well as to detect the intensity of the laser beam through said light-detecting element, wherein said slide base comprises:

a planar portion spaced from and parallel to said main substrate; and at least one extended portion integral with and extending away from said planar portion, at an angle with said planar portion and toward said main substrate, said at least one extended portion having a distal end face spaced from said main substrate to define a gap slightly greater than the thickness of one of said cables which extends through said gap.

4. An optical pick-up according to claim 3 wherein said distal end of said first extended portion is spaced from the solder connection in a direction parallel to said planar portion.

5. An optical pickup in which a printed-wiring main substrate is mounted on one surface of a slide base movable back-and-forth in the radial direction of a disk, while a standing frame is formed integrally on a second surface of said slide base, opposite said one surface, a light source element and reading and light-detecting elements being positioned and fixed to said standing frame, and end portions of flexible flat cables extending from said respective elements are soldered to said main substrate at solder connections, where a laser beam from said light source element is adapted to be applied to the disk and the reflected light is adapted to be received at said reading element to read information recorded on the disk as well as to detect the intensity of the laser beam through said light-detecting element, wherein said slide base comprises:

a planar portion spaced from and parallel to said main substrate; and an insertion opening, in said planar portion, through which an end portion of one of said cables extends from said light source element to a solder connection on said main substrate; and an extended portion integral with and extending away from a peripheral edge of said insertion opening, at an angle with and toward said main substrate, said extended portion having a distal end face spaced from said main substrate to define a gap slightly greater than the thickness of one of said cables which extends through said gap.

6. An optical pick-up according to claim 5 wherein said distal end of said first extended portion is spaced from the solder connection in a direction parallel to said planar portion.

7. An optical pickup in which a printed-wiring main substrate is mounted on one surface of a slide base movable back-and-forth in the radial direction of a disk, while a standing frame is formed integrally on the other surface of said slide base, opposite said one surface, a light source element and reading and light-detecting elements being positioned and fixed to said standing frame, and end portions of flexible flat cables extending from said respective elements are soldered to said main substrate at solder connections, where a laser beam from said light source element is adapted to be applied to the disk and the reflected light is adapted to be received at said reading element to read information recorded on the disk as well as to detect the intensity of the laser beam through said light-detecting element, wherein said slide base comprises:

a planar portion spaced from and parallel to said main substrate; and an extended portion integral with and extending from an outer peripheral edge of said planar portion of said slide base, at an angle with said planar portion and toward said main substrate, said extended portion having a distal face spaced from said main substrate to define therebetween a gap slightly greater than the thickness of one of said cables which extends through said gap.

8. An optical pick-up according to claim 7 wherein said distal end of said first extended portion is spaced from the solder connection in a direction parallel to said planar portion.

* * * * *

UNITED STATES PATENT AND TRADEMARK OFFICE
CERTIFICATE OF CORRECTION

PATENT NO.       : 7,592,585 B2
APPLICATION NO.  : 11/905871
DATED            : September 22, 2009
INVENTOR(S)      : Masaaki Suetsugu Page 1 of 1

It is certified that error appears in the above-identified patent and that said Letters Patent is hereby corrected as shown below:

Column 8, Line 44 (claim 7, line 21) add "end" after "distal".

Signed and Sealed this

Twenty-second Day of December, 2009

David J. Kappos
*Director of the United States Patent and Trademark Office*